(12) United States Patent
Besling et al.

(10) Patent No.: US 8,455,357 B2
(45) Date of Patent: Jun. 4, 2013

(54) METHOD OF PLATING THROUGH WAFER VIAS IN A WAFER FOR 3D PACKAGING

(75) Inventors: Willem Frederik Adrianus Besling, Eindhoven (NL); Freddy Roozeboom, Eindhoven (NL); Yann Pierre Roger Lamy, Eindhoven (NL)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/120,988

(22) PCT Filed: Sep. 28, 2009

(86) PCT No.: PCT/IB2009/054233
§ 371 (c)(1),
(2), (4) Date: Aug. 17, 2011

(87) PCT Pub. No.: WO2010/041165
PCT Pub. Date: Apr. 15, 2010

(65) Prior Publication Data
US 2012/0133047 A1    May 31, 2012

(30) Foreign Application Priority Data
Oct. 10, 2008    (EP) .................................... 08166357

(51) Int. Cl.
*H01L 21/44* (2006.01)
*H01L 21/4763* (2006.01)
*H01L 21/311* (2006.01)
*H01L 29/40* (2006.01)
*H01L 23/053* (2006.01)
*H01L 23/12* (2006.01)
*H01L 23/48* (2006.01)
*H01L 23/52* (2006.01)

(52) U.S. Cl.
USPC ........... 438/667; 438/629; 438/637; 438/638; 438/639; 438/640; 438/668; 438/672; 438/675; 438/700; 257/621; 257/700; 257/774; 257/E21.597

(58) Field of Classification Search
USPC .......... 257/621, 700, 774, E21.597; 438/629, 438/637, 638, 639, 640, 667, 668, 672, 675, 438/700
See application file for complete search history.

(56) References Cited

U.S. PATENT DOCUMENTS

| | | | | |
|---|---|---|---|---|
| 4,978,639 | A  * | 12/1990 | Hua et al. ...................... | 438/465 |
| 5,111,278 | A  * | 5/1992 | Eichelberger ................. | 257/698 |
| 6,162,365 | A  * | 12/2000 | Bhatt et al. .................... | 216/13 |
| 6,541,301 | B1 * | 4/2003 | Raymond ...................... | 438/106 |
| 7,230,318 | B2 * | 6/2007 | Kripesh et al. ................ | 257/621 |
| 7,265,052 | B2 * | 9/2007 | Sinha ............................ | 438/675 |
| 7,355,267 | B2 * | 4/2008 | Kirby et al. ................... | 257/621 |
| 7,371,073 | B2 * | 5/2008 | Williams ........................ | 439/66 |
| 7,531,443 | B2 * | 5/2009 | Pratt .............................. | 438/618 |
| 7,557,014 | B2 * | 7/2009 | Okamoto et al. ............. | 438/396 |

(Continued)

*Primary Examiner* — Ida M Soward
(74) *Attorney, Agent, or Firm* — McClure, Qualey & Rodack, LLP

(57) ABSTRACT

A method of plating via hole in a substrate includes providing a substrate having a first side and a second side and a plurality of through substrate via holes; depositing a first seed layer on the first side of the substrate; applying a foil on the first seed layer of the substrate closing the first ends of the plurality of via holes; electro-chemical plating of the second side of the substrate; and removing the foil.

14 Claims, 4 Drawing Sheets

U.S. PATENT DOCUMENTS

| | | | | |
|---|---|---|---|---|
| 7,560,650 B2* | 7/2009 | Chan et al. | | 174/255 |
| 7,592,706 B2* | 9/2009 | Hsu | | 257/777 |
| 7,772,118 B2* | 8/2010 | Yamano | | 438/667 |
| 7,985,622 B2* | 7/2011 | Nalla et al. | | 438/110 |
| 8,102,049 B2* | 1/2012 | Takahashi et al. | | 257/741 |
| 8,105,940 B2* | 1/2012 | Christensen et al. | | 438/637 |
| 8,263,491 B2* | 9/2012 | Binder et al. | | 438/667 |
| 2007/0259517 A1* | 11/2007 | Benson et al. | | 438/618 |
| 2008/0164573 A1* | 7/2008 | Basker et al. | | 257/621 |
| 2009/0236749 A1* | 9/2009 | Otremba et al. | | 257/774 |
| 2009/0283898 A1* | 11/2009 | Janzen et al. | | 257/698 |
| 2012/0279866 A1* | 11/2012 | Fredenberg et al. | | 205/131 |

* cited by examiner

METHOD OF PLATING THROUGH WAFER VIAS IN A WAFER FOR 3D PACKAGING

CROSS-REFERENCE TO RELATED APPLICATION

This application is a co-pending application which claims priority to PCT Application No. PCT/IB2009/054233, filed, 28 Sep. 2009, entitled "Method of Plating Through Wafer Vias in a Wafer for 3D Packaging" which claims priority to European Patent Application No. 08166357.7, filed on 10 Oct. 2008 each of these applications being incorporated herein by reference in their entirety.

FIELD OF THE INVENTION

The present invention relates to a method of plating through wafer vias in a wafer for 3D packaging.

BACKGROUND OF THE INVENTION

Modern electronic devices typically comprise a plurality of integrated circuits which are implemented on a wafer. Furthermore, system-in-package SiP devices comprise a plurality of dies stacked on top of each other. These dies need to be electrically interconnected. This is typically performed by means of through wafer holes or via interconnects which can be filled with Cu. The system-in-package devices may comprise elements or units from different technologies like passive dies in combination with a video processor, DSP co-processor, MEMS dies, transceivers, memories and graphic dies in silicon as well as in GaAS. Here, three dimensional interconnects are required. These interconnections may comprise vias that are filled with electrically conductive material. However, it should be noted that these vias have not been able to cater for different requirements, i.e. the vias must be insulated from the semiconductor substrate, and the conductor fillings of the via must be of the highest conductivity for most RF applications. Copper has a resistivity below 2 $\mu\Omega$.cm and is therefore often used. The position of the copper is typically performed by electro-plating on a conductive seed layer. The width of the vias can range from 10 to 100 µm according to the application. The depths of the vias are usually between 100 and 300 µm.

FIG. 1 shows a schematic representation of a method of filing vias with Cu according to the prior art. Here, vias 110 are etched completely through the silicon layer 100. Thereafter, the vias 110 in the silicon layer is sealed by a sealing layer 120 at the back side of the wafer. Thereafter, the via is filled by bottom-up electro-plating. This can be started at the sealing layer 120. After the filling process, the via hole 110 is filled with copper Cu 130.

However, it should be noted that the sealing step of the via holes 110 is a critical step. Preferably, all vias should be sealed identically and the sealing should be performed at the same time in order to guarantee a uniformity of the bottom-up plating. Moreover, the sealing must exclude voids for a good electrical contact. The electro-chemical plating can result to a formation of copper bumps while other vias are not completely filled if the sealing has not been performed uniformly and at a controlled depth. In addition, any overgrowth of copper should be reduced on the back side of the wafer in order to prevent additional steps of a Cu removal.

FIG. 2 shows a representation of an alternative via sealing method according to the prior art. Here, PMMA polymer bridges are used to cap the via holes 110. In step a), an oxide layer 150 is provided on top of the silicon substrate. In step b), part of the oxide 150 is etched and in step c), a via hole 110 is etched partly into the silicon layer 100. In step d), an oxide layer 150 is deposited in the via hole 100. In step e), a PMMA layer 160 is provided on top of the oxide layer 150, wherein the PMMA 160 creates a bridge over the via hole 110. The PMMA 160 can be deposited by conventional spinning In step f), the access PMMA 160 is removed with chemical mechanical polishing. In step g), a seed layer Ti/Cu is deposited on the PMMA bridge. In step i), the PMMA bridge is removed and a free standing conductive membrane is provided over the via. In steps j) and k), the via hole is filled with copper.

However, it should be noted that a plurality of process steps are required. One critical point can be the chemical mechanical polishing CMP step to remove the PMMA in particular for thinned wafers. The risk of breaking the wafer is high and such a process is not cost effective.

FIG. 3 shows an alternative plating method according to the prior art. Here, a global sealing by means of a direct electro-plating on a Cu seed layer is described. The deposition of the seed layer 101 can be performed by conventional physical vapour deposition PVD. Here, the seed layer 101 only covers the top of the via 110 as the physical vapour deposition PVD merely has a low step coverage. Vias can be sealed by directly plating on the seed layer 101. The copper Cu can also grow inside the via 110 and on the field of the wafer. The via can be closed after sufficient plating time. However, it should be noted that this technique is very slow as a huge area needs to be plated. In addition, this process is very costly. Moreover, the thickness of the Cu layer is approx. 40 µm. Furthermore, this layer must be deposited on the side of the wafer in order to close the via. Moreover, it needs to be removed afterwards for example by means of chemical mechanical polishing.

Alternatively, resist trenches 103 can be provided and can be used to perform the Cu plating. Here, the thickness of the Cu layer can be reduced but is still approx. 30 µm. In addition, extra process steps like Cu grinding, chemical mechanical polishing, etc. need to be performed to remove the overfilling of the via holes. In addition, the wafer breakage during the handling is high and the costs are also high.

Finally, the wafer must be flipped over in order to perform a bottom-up electro-plating to complete the filling of the via holes. Accordingly, an extra handling step is required.

In "Reducing the Electro deposition Time for Filling Microvias with Copper for 3D Technology", by Lühn et al., in IEEE Electronic Components and Technology Conference 2008 methods for reducing the electro-deposition time for filling vias are described.

SUMMARY OF THE INVENTION

It is an object of the present invention to provide a method of plating through wafer vias which is more cost effective and which allows a better handling of the wafers. It is a further object of the invention to overcome one or more drawbacks of the prior art mentioned above.

This object is solved by a method of plating through via holes according to claim 1.

Therefore, a method of plating wafer via holes in a wafer is provided. A substrate having a first and second side and a plurality of wafer via holes is provided. Each via hole comprises a first and second end extending between the first and second side. A first seed layer is deposited on the first side of the wafer. A foil is applied on the first seed layer of the wafer closing the first ends of the plurality of wafer via holes. The second side of the wafer is electro-chemically plated and the foil is removed.

According to an aspect of the invention a second seed layer is deposited on the second side of the wafer before the electro-chemical plating.

According to an aspect of the invention the first ends of the plurality of wafer via holes are at least partly sealed before applying the foil.

According to an aspect of the invention the first ends of the plurality of wafer via holes are tapered before depositing the first seed layer.

According to an aspect of the invention the plurality of wafer via holes are tapered before depositing the first seed layer.

The invention also relates to System-in-package device obtainable or obtained by a method as described above.

The invention also relates to a use of a foil in the plating of wafer via holes in a wafer for providing a void-free sealing of the wafer via holes.

The invention also relates to a semiconductor device, comprising at least one via hole plated by a method of plating wafer via holes in a wafer as described above.

The invention relates to the idea to combine the usage of a foil applied on top of a seed layer and a direct sealing of the via by means of bottom-up electro-plating from the opposite side of the wafer. The foil is used to prevent an overfilling of the copper of the wafer at the front side. The copper will force the growth of the Cu in the lateral direction and can allow a sealing of the top part of the via.

The invention further relates to the idea to assist the closure or sealing of via holes by applying a foil on one side of the wafer. Preferably, this is performed after depositing a seed layer for electro-plating one side of the wafer. The provision of the foil is advantageous as the Cu will only grow in the via and in a lateral direction such that a void-free sealing of the via by Cu can be achieved. Then a bottom-up electroplating can be performed to completely fill the via. Afterwards the foil can be removed.

Further aspects of the invention are defined in the depending claims.

BRIEF DESCRIPTION OF THE DRAWINGS

Advantages and embodiments of the present application will be described in more detail with reference to the Figures.

FIG. 4 shows a schematic diagram of a method of plating through wafer vias according to a first embodiment. A seed layer 220 can be provided on a silicon substrate 200 with via holes 210 and the seed layer 220 may also partly extend into the via holes 210. On top of the seed layer 220, a foil 250 is provided on one side, e.g. the front side of the wafer. The via 210 can be sealed by means of bottom-up electro-plating from the back side of the wafer. The foil 250 is advantageous as it can prevent an overfilling of the copper at the front side of the wafer and re-enforce the wafer if is has been thinned down. Moreover, the foil 250 is advantageous as the growth of the Cu is performed in the lateral direction such that a sealing is only allowed in the top part of the via.

The electro-plating step is performed from the open end of the via 210 in the back side of the wafer. The plating is started on the Cu seed layer 220 which can extend into the via 210. The sealing can be much faster as only the via must be sealed. Here, the electro-plating can be performed with a high density current such that the sealing time can be reduced to for example one hour. However, it should be noted that the sealing time will also depend on the diameter of the vias. Moreover, the sealing as well as the bottom-up filling of the vias can be performed in a single step. This is advantageous as no additional contact resistance between the via and the metal interconnect is present. This can be achieved as the sealing and the bottom-up via filling is performed in a single step.

The plating parameters such as current density, pulse ratio, agitation speed, $Cu^{2+}$ concentration can be used to control the sealing. The sealing depth will directly depend on the seed layer thickness. The thinner the seed layer the better, as for a very thin seed layer, only a very thin layer is deposited on the via. The seed layer which does not penetrate too much into the via. An accurate sealing is allowed when the sealing occurs at the very top of the via.

The provision of the foil is advantageous as it prevents an overfilling and a copper bumps on the front side. Moreover, the plating technique according to the invention can allow a simultaneous sealing of vias with different sizes such that a freedom of processing is achieved. The provision of the foiling is also advantageous with respect to the handling of a thin wafer. The foil can be kept on the wafer as long as the wafer is processed. This is advantageous, as the foil will strengthen the wafer.

Figure 1:
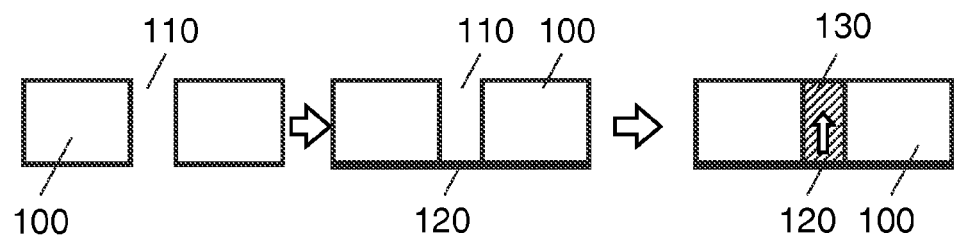
FIG. 1 shows a schematic representation of a method of filing vias with cu according to the prior art.
Figure 2:
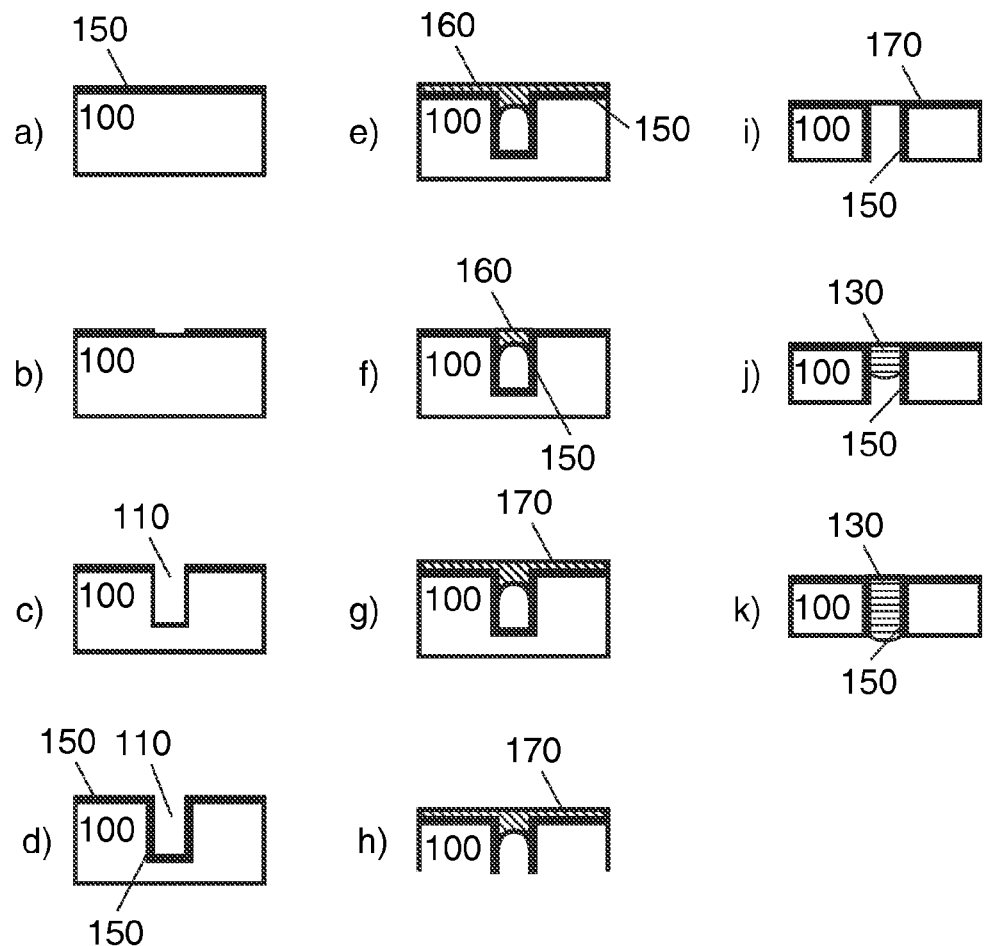
FIG. 2 shows a representation of an alternative via sealing method according to the prior art.
Figure 3:
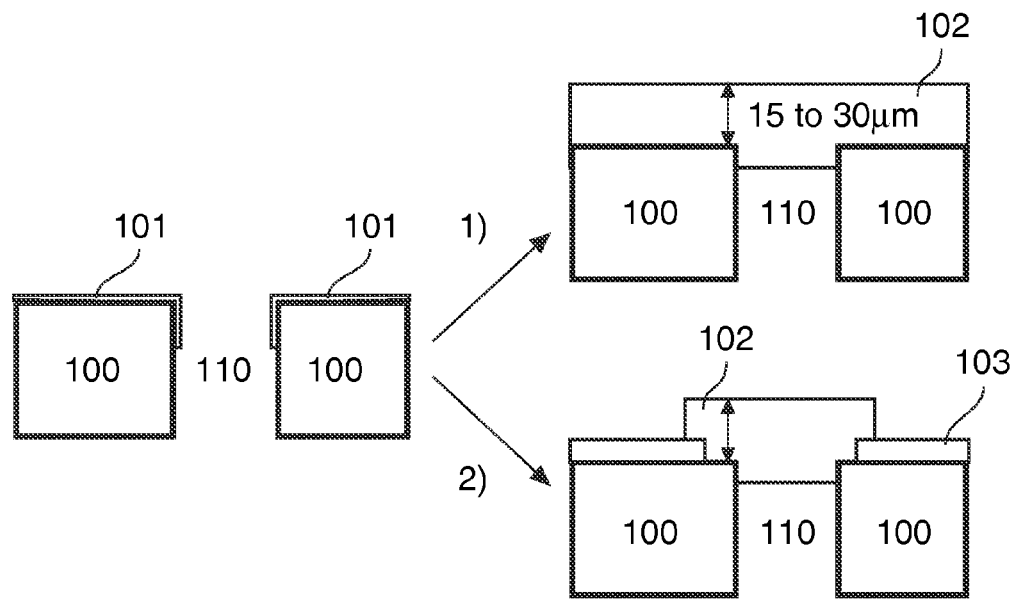
FIG. 3 shows a representation of an alternative plating method according to the prior art.
Figure 4:
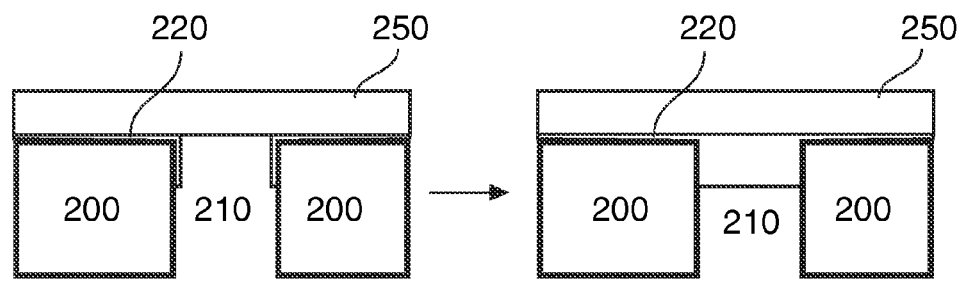
FIG. 4 shows a schematic diagram of a method of plating through wafer vias according to a first embodiment.
Figure 5A:
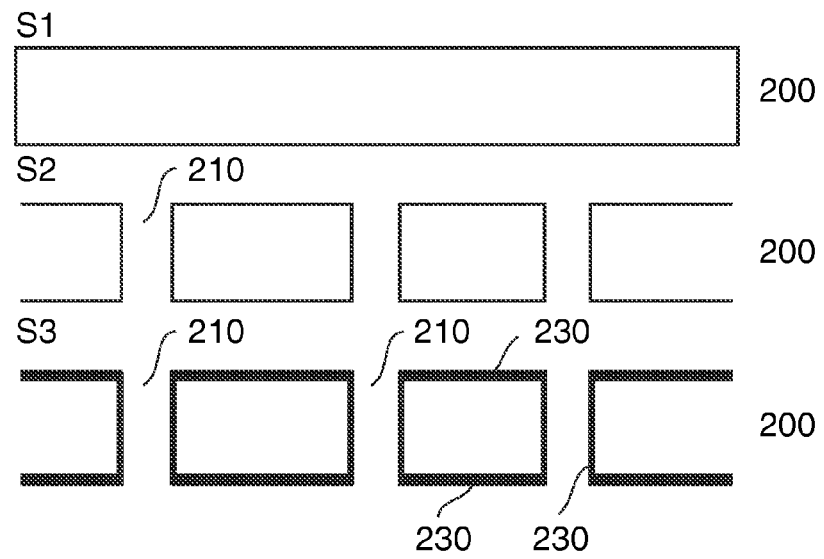
FIGS. 5A to 5C show schematic representations of a method of plating through wafer vias according to a second embodiment.
Figure 5B:
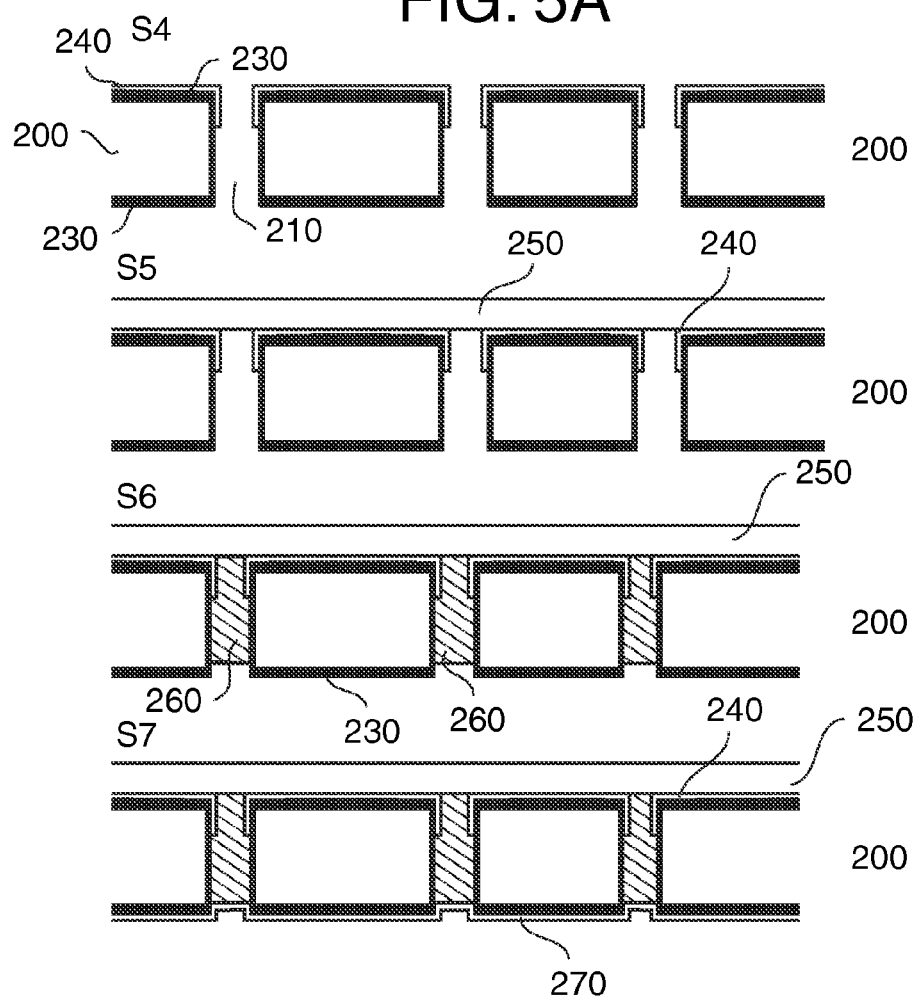
Figure 5C:
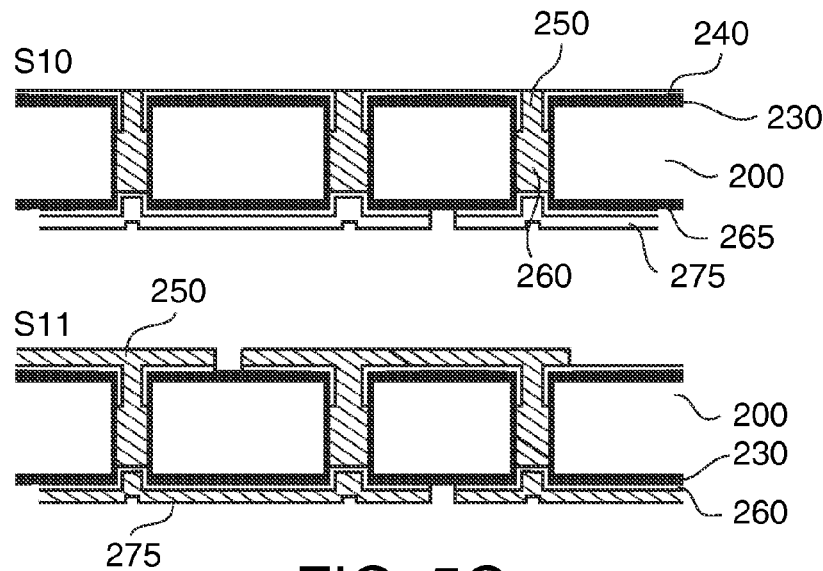

FIGS. 5A to 5C show schematic representations of methods of plating through wafer vias according to a second embodiment. Here, a process flow according to the invention is described. In step S1, a silicon wafer 200 is provided. The silicon wafer 200 may also comprise a passive integration. In step S2, through wafer via holes 210 are generated or etched for example by means of deep reactive iron etching, laser drilling, powder blasting, photo chemical etching, etc. In step S3, the via walls are insulated and a layer 230 is applied. This can for example be performed by means of chemical vapour deposition CVD (ex: $SiO_2$, $Si_3N_4$ . . .).

In step S4, a seed layer 240 is provided on the silicon wafer 200 and is partly extending into the via holes 210. In step 55, a foil 250 is applied on top of the seed layer 240, e.g. at the front of the wafer. In step S6, an electro-chemical plating is performed from the other side of the wafer filling the via holes. In step S7, a second seed layer 270 is applied to the back side of the wafer. In step S10, the foil is removed and a layer 275 is applied. In step S10, the front side is patterned.

The deposition of the seed layer 240 can for example be performed by physical vapour deposition PVD. The seed layer on the front side 240 as well as on the back side 270 can have a thickness between 100-200 nm. It should be noted that the amount of copper inside the via and the depth of the via is directly dependent on the thickness of the seed layer. It should be noted that the depth which can be achieved by the seed layer is approx. 3 times the width of the via. Moreover, the step coverage does not exceed 15%. The penetration of the seed layer is limited in the via. The seed layer can become discontinuous if it is too thin.

The foil 250 as mentioned above needs to be resistant to moderate acid solutions such as a $Cu^{2+}/H_2SO_4^{-2}$ plating solution and it should be easy to tape and de-tape. These foils can for example be "blue foils" which are used for dicing, e.g. GT 204 foil. Furthermore, a Kempton foil can be used such as a standard thermal and UV-tape as long as they meet the above-described requirements. Such a foil is cheap, easy to mount and demount and is able to withstand acids as well as thermal budgets<150° C. Moreover, it should be noted that the sealing depth is dependent on the depth of the penetration of the seed layer. Furthermore, it is directly dependent on the thickness of the seed layer on the field of the wafer.

Figure 6:
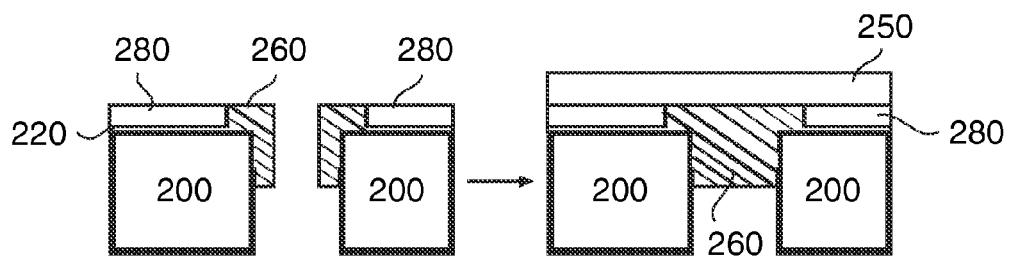
FIG. 6 shows a schematic representation of a method of plating through wafer vias according to a third embodiment.

FIG. 6 shows a schematic representation of a method of plating through wafer vias according to a third embodiment. Here, a pre-sealing and a front side metal re-routing is performed before a foil 250 is applied and the via is sealed and a seed layer is provided and a photo resistor 280 is provided on the seed layer before a pre-sealing of the via hole is performed. This process is advantageous as the front side of the wafer is completely processed before the foil 250 is applied. As the front side has been completely processed, the foil can stay attached to the front side of the wafer until the processing has ended. This will increase the stability of the wafer during the process. Accordingly, the handling of the wafer will be improved.

Figure 7:
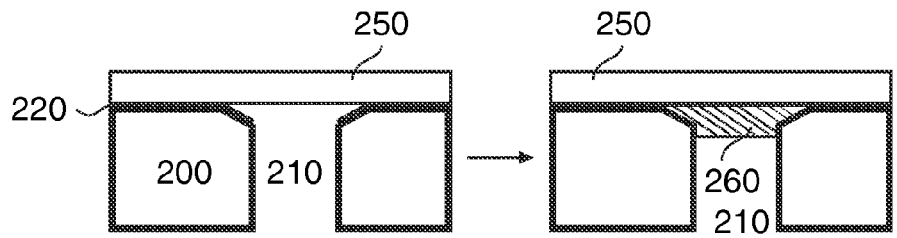
FIG. 7 shows a schematic representation of a method of plating through wafer vias according to a fourth embodiment.

FIG. 7 shows a schematic representation of a method of plating through wafer vias according to a fourth embodiment. According to the fourth embodiment, a seed layer is provided on the silicon wafer having a plurality of via holes 210. For example, at the front side of the wafer, notches can be provided at the edges of the via holes 210. In other words, pre-shaped top corner vias can be provided before a foil 250 is applied to the front side of the wafer. The shape of the top corner vias should be tapered in order to facilitate the deposition of a seed layer. This can for example be performed by means of physical vapour deposition PVD. Here, the sealing of the via hole 210 will only be applied at the notches having a seed layer 220 deposited on top. This is advantageous as a local sealing can be provided. It should be noted that the tapered corners of the vias can be performed by means of a plurality of different techniques.

Figure 8:
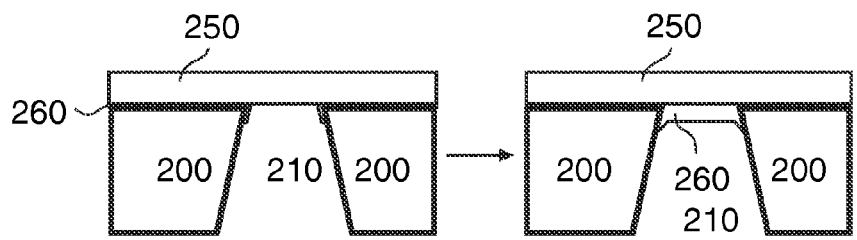
FIG. 8 shows a schematic representation of a method of plating through wafer vias according to a fifth embodiment.

FIG. 8 shows a schematic representation of a method of plating through wafer vias according to a fifth embodiment. Here, via holes 210 are provided in a silicon wafer. On top of the silicon, a seed layer 220 is provided. But the seed layer will not extend over the via holes 210. This can be achieved by providing tapered via holes. In FIG. 8, this tapering is depicted as a negative slope. This is advantageous as the seed layer will not extend far into the via holes. This is advantageous as the sealing of the via holes will be very localized.

The above described method of plating through wafer via can be used to enable a three-dimensional integration of stacked wafers or dies, which require through wafer vias. It should be noted that this can also be applied for any application which requires a three-dimensional access for example for micro fluids, cooling interconnects, etc.

Further applications of the invention are 3D packaging, 3D interconnects, interposing, re-routing and heat transfer.

In addition, the sealing method can also be provided for closing or sealing vias or cavity with an electro-plated conductive material.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be constrained as limiting the scope of the claims.

The invention claimed is:

1. A method of plating via holes in a substrate, comprising the steps of:
    providing a substrate having a first side and a second side and a plurality of via holes each having a first end and a second end extending between the first and the second side;
    depositing a first seed layer on the first side of the substrate;
    applying a foil on the first seed layer of the substrate closing on the first ends of the plurality of via holes;
    electro-chemical plating of the second side of the substrate; and
    removing the foil.

2. The method according to claim 1, further comprising the step of:
    tapering the plurality of via holes before depositing the first seed layer.

3. The method according to claim 1, wherein the substrate is a silicon wafer.

4. The method according to claim 1, further comprising forming a photo resistor on the first seed layer before the foil is applied.

5. The method according to claim 1, further comprising the step of:
    tapering the first ends of the plurality of via holes before depositing the first seed layer.

6. The method according to claim 5, further comprising the step of:
    tapering the plurality of via holes before depositing the first seed layer.

7. The method according to claim 1, further comprising the step of:
    at least partially sealing the first ends of the plurality of via holes before applying the foil.

8. The method according to claim 7, further comprising the step of:
    tapering the first ends of the plurality of via holes before depositing the first seed layer.

9. The method according to claim 7, further comprising the step of:
    tapering the plurality of via holes before depositing the first seed layer.

10. The method according to claim 1, further comprising the step of:
    depositing s second seed layer on the second side of the substrate after the electro-chemical plating.

11. The method according to claim 10, further comprising the step of:
    at least partially sealing the first ends of the plurality of via holes before applying the foil.

12. The method according to claim 10, further comprising the step of:

tapering the first ends of the plurality of via holes before depositing the first seed layer.

13. The method according to claim 10, further comprising the step of:

tapering the plurality of via holes before depositing the first seed layer.

14. A method of manufacturing a system-in-package device, comprising:

a method of plating via holes in a substrate, wherein the method comprises:

providing a substrate having a first side and a second side and a plurality of via holes each having a first end and a second end extending between the first and the second side;

depositing a first seed layer on the first side of the substrate;

applying a foil on the first seed layer of the substrate closing on the first ends of the plurality of via holes;

electro-chemical plating of the second side of the substrate; and removing the foil.

* * * * *